United States Patent
Choi et al.

(10) Patent No.: US 8,328,939 B2
(45) Date of Patent: *Dec. 11, 2012

(54) DIFFUSER PLATE WITH SLIT VALVE COMPENSATION

(75) Inventors: Soo Young Choi, Fremont, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1303 days.

This patent is subject to a terminal disclaimer.

(21) Appl. No.: 11/780,478

(22) Filed: Jul. 20, 2007

(65) Prior Publication Data

US 2008/0020146 A1    Jan. 24, 2008

Related U.S. Application Data

(63) Continuation-in-part of application No. 10/889,683, filed on Jul. 12, 2004, now Pat. No. 8,083,853.

(60) Provisional application No. 60/570,876, filed on May 12, 2004.

(51) Int. Cl.
   *C23C 16/00* (2006.01)
   *C23C 16/455* (2006.01)
   *C23C 16/50* (2006.01)
   *C23C 16/507* (2006.01)
   *H01L 21/3065* (2006.01)

(52) U.S. Cl. ............... 118/715; 118/723 E; 156/345.33; 156/345.34; 156/345.43; 156/345.47

(58) Field of Classification Search .................. 118/715, 118/723 E; 156/345.33, 345.34, 345.43, 156/345.47

See application file for complete search history.

(56) References Cited

U.S. PATENT DOCUMENTS

| 3,603,284 | A | * | 9/1971 | Garnache | ..................... 118/725 |
| 3,830,194 | A | | 8/1974 | Benzing et al. | |
| 3,854,443 | A | | 12/1974 | Baerg | |
| 4,474,358 | A | | 10/1984 | Bennett | |
| 4,491,520 | A | | 1/1985 | Jaye et al. | |
| 4,522,149 | A | | 6/1985 | Garbis et al. | |
| 4,563,367 | A | | 1/1986 | Sherman | |
| 4,726,924 | A | | 2/1988 | Mittelstadt | |
| 4,763,690 | A | | 8/1988 | Martin | |

(Continued)

FOREIGN PATENT DOCUMENTS

CN    1501762    6/2004

(Continued)

OTHER PUBLICATIONS

Chinese Office Action dated Jul. 27, 2007 for Chinese Application No. 200510106396.9.

(Continued)

*Primary Examiner* — Jeffrie R Lund
(74) *Attorney, Agent, or Firm* — Patterson & Sheridan, LLP

(57) ABSTRACT

The present invention generally comprises a diffuser plate for a PECVD chamber. The diffuser plate comprises a plurality of hollow cathode cavities. The edge of the diffuser plate that will reside closest to a slit valve within a processing chamber may have the shape and/or size of the hollow cathode cavities adjusted to compensate for the proximity to the slit valve. By adjusting the shape and/or size of the hollow cathode cavities closest to the slit valve, the diffuser plate may permit a uniform plasma distribution across the processing chamber and thus, a uniform film thickness upon a substrate during a PECVD process.

24 Claims, 4 Drawing Sheets

U.S. PATENT DOCUMENTS

| | | | |
|---|---|---|---|
| 4,780,169 A | 10/1988 | Stark et al. |
| 4,792,378 A | 12/1988 | Rose et al. |
| 4,799,418 A | 1/1989 | Takahashi et al. |
| 4,809,421 A | 3/1989 | Justice |
| 4,854,263 A | 8/1989 | Chang et al. |
| 4,927,991 A | 5/1990 | Wendt et al. |
| 4,993,358 A | 2/1991 | Mahawili |
| 5,000,113 A | 3/1991 | Wang et al. |
| 5,044,943 A | 9/1991 | Bowman et al. |
| 5,124,635 A | 6/1992 | Henley et al. |
| 5,152,504 A | 10/1992 | Nixon et al. |
| 5,173,580 A | 12/1992 | Levin et al. |
| 5,248,371 A | 9/1993 | Maher et al. |
| 5,268,034 A | 12/1993 | Vukelic |
| 5,332,443 A | 7/1994 | Chew et al. |
| 5,339,387 A | 8/1994 | Frankel |
| 5,399,387 A | 3/1995 | Law et al. |
| 5,421,893 A | 6/1995 | Perlov |
| 5,439,524 A | 8/1995 | Cain et al. |
| 5,500,256 A | 3/1996 | Watabe et al. |
| 5,503,809 A | 4/1996 | Coate et al. |
| 5,567,243 A | 10/1996 | Foster et al. |
| 5,582,866 A | 12/1996 | White |
| 5,611,865 A | 3/1997 | White et al. |
| 5,614,026 A | 3/1997 | Williams |
| 5,614,055 A | 3/1997 | Fairbairn et al. |
| 5,628,829 A | 5/1997 | Foster et al. |
| 5,628,869 A | 5/1997 | Mallon |
| 5,647,911 A | 7/1997 | Vanell et al. |
| 5,714,408 A | 2/1998 | Ichikawa et al. |
| 5,766,364 A | 6/1998 | Ishida et al. |
| 5,819,434 A | 10/1998 | Herchen et al. |
| 5,820,686 A | 10/1998 | Moore |
| 5,844,205 A | 12/1998 | White et al. |
| 5,846,332 A | 12/1998 | Zhao et al. |
| 5,876,838 A | 3/1999 | Mallon |
| 5,882,411 A | 3/1999 | Zhao et al. |
| 5,928,732 A | 7/1999 | Law et al. |
| 5,950,925 A | 9/1999 | Fukunaga et al. |
| 5,968,276 A | 10/1999 | Lei et al. |
| 5,990,016 A | 11/1999 | Kim et al. |
| 5,994,678 A | 11/1999 | Zhao et al. |
| 5,997,649 A | 12/1999 | Hillman |
| 6,024,799 A | 2/2000 | Chen et al. |
| 6,030,508 A | 2/2000 | Yang et al. |
| 6,040,022 A | 3/2000 | Chang et al. |
| 6,041,733 A | 3/2000 | Kim et al. |
| 6,041,734 A * | 3/2000 | Raoux et al. | 118/723 E |
| 6,050,506 A | 4/2000 | Guo et al. |
| 6,079,356 A | 6/2000 | Umotoy et al. |
| 6,098,568 A * | 8/2000 | Raoux et al. | 118/723 E |
| 6,113,700 A | 9/2000 | Choi et al. |
| 6,123,775 A | 9/2000 | Hao et al. |
| 6,132,512 A | 10/2000 | Horie et al. |
| 6,140,255 A | 10/2000 | Ngo et al. |
| 6,148,765 A | 11/2000 | Lilleland et al. |
| 6,149,365 A | 11/2000 | White et al. |
| 6,150,283 A | 11/2000 | Ishiguro et al. |
| 6,170,432 B1 | 1/2001 | Szapucki et al. |
| 6,176,668 B1 | 1/2001 | Kurita et al. |
| 6,182,602 B1 | 2/2001 | Redeker et al. |
| 6,182,603 B1 | 2/2001 | Shang et al. |
| 6,197,151 B1 | 3/2001 | Kaji et al. |
| 6,203,622 B1 | 3/2001 | Halpin et al. |
| 6,228,438 B1 | 5/2001 | Schmitt |
| 6,232,218 B1 | 5/2001 | Cathey et al. |
| 6,254,742 B1 | 7/2001 | Hanson et al. |
| 6,281,469 B1 | 8/2001 | Perrin et al. |
| 6,302,057 B1 | 10/2001 | Leusink et al. |
| 6,338,874 B1 | 1/2002 | Law et al. |
| 6,344,420 B1 | 2/2002 | Miyajima et al. |
| 6,364,949 B1 | 4/2002 | Or et al. |
| 6,371,712 B1 | 4/2002 | White et al. |
| 6,383,573 B1 | 5/2002 | Beck et al. |
| 6,428,850 B1 | 8/2002 | Shinriki et al. |
| 6,444,040 B1 | 9/2002 | Herchen et al. |
| 6,447,980 B1 | 9/2002 | Rahman et al. |
| 6,454,855 B1 | 9/2002 | Von Kanel et al. |
| 6,454,860 B2 * | 9/2002 | Metzner et al. | 118/715 |
| 6,477,980 B1 | 11/2002 | White et al. |
| 6,502,530 B1 | 1/2003 | Turlot et al. |
| 6,527,908 B2 | 3/2003 | Kanetsuki et al. |
| 6,548,112 B1 | 4/2003 | Hillman et al. |
| 6,548,122 B1 | 4/2003 | Sharma et al. |
| 6,556,536 B1 | 4/2003 | Reynolds et al. |
| 6,565,661 B1 | 5/2003 | Nguyen |
| 6,566,186 B1 | 5/2003 | Allman et al. |
| 6,593,548 B2 | 7/2003 | Matsumura et al. |
| 6,596,576 B2 | 7/2003 | Fu et al. |
| 6,599,367 B1 | 7/2003 | Nakatsuka |
| 6,616,766 B2 | 9/2003 | Dunham |
| 6,619,131 B2 | 9/2003 | Walchi et al. |
| 6,626,988 B1 | 9/2003 | Schmalstieg et al. |
| 6,626,998 B1 | 9/2003 | Dunham |
| 6,631,692 B1 | 10/2003 | Matsuki et al. |
| 6,663,025 B1 | 12/2003 | Halsey et al. |
| 6,664,202 B2 | 12/2003 | Tang et al. |
| 6,682,630 B1 | 1/2004 | Colpo et al. |
| 6,683,216 B1 | 1/2004 | Zoeller et al. |
| 6,740,367 B2 | 5/2004 | Matsuki et al. |
| 6,756,324 B1 | 6/2004 | Gates |
| 6,772,827 B2 | 8/2004 | Keller et al. |
| 6,793,733 B2 | 9/2004 | Janakiraman et al. |
| 6,814,838 B2 | 11/2004 | Weichart |
| 6,821,347 B2 | 11/2004 | Carpenter et al. |
| 6,828,246 B2 * | 12/2004 | Tu et al. | 438/710 |
| 6,852,168 B2 | 2/2005 | Park |
| 6,860,965 B1 | 3/2005 | Stevens |
| 6,873,764 B2 | 3/2005 | Maisenhoelder et al. |
| 6,881,684 B2 | 4/2005 | Aota et al. |
| 6,916,407 B2 | 7/2005 | Voser et al. |
| 6,918,352 B2 | 7/2005 | Von Kanel et al. |
| 6,924,241 B2 | 8/2005 | Lee |
| 6,942,753 B2 | 9/2005 | Choi et al. |
| 6,961,490 B2 | 11/2005 | Maisenhoelder et al. |
| 7,125,758 B2 | 10/2006 | Choi et al. |
| 2001/0021422 A1 | 9/2001 | Yamakoshi et al. |
| 2001/0023742 A1 | 9/2001 | Schmitt |
| 2001/0029892 A1 | 10/2001 | Cook et al. |
| 2002/0006478 A1 | 1/2002 | Yuda et al. |
| 2002/0011215 A1 | 1/2002 | Tei et al. |
| 2002/0129769 A1 | 9/2002 | Kim et al. |
| 2002/0134309 A1 | 9/2002 | Tu et al. |
| 2002/0146879 A1 | 10/2002 | Fu et al. |
| 2002/0174950 A1 | 11/2002 | Park |
| 2002/0189545 A1 | 12/2002 | Matsumura et al. |
| 2003/0089314 A1 | 5/2003 | Matsuki et al. |
| 2003/0143410 A1 | 7/2003 | Won et al. |
| 2003/0170388 A1 | 9/2003 | Shinriki et al. |
| 2003/0199175 A1 | 10/2003 | Tang et al. |
| 2003/0207033 A1 | 11/2003 | Yim et al. |
| 2003/0209323 A1 | 11/2003 | Yokogaki |
| 2004/0003777 A1 | 1/2004 | Carpenter et al. |
| 2004/0043637 A1 | 3/2004 | Aota et al. |
| 2004/0055537 A1 | 3/2004 | Kurita et al. |
| 2004/0064407 A1 | 4/2004 | Kight et al. |
| 2004/0129211 A1 | 7/2004 | Blonigan et al. |
| 2004/0145383 A1 | 7/2004 | Brunner |
| 2004/0206305 A1 * | 10/2004 | Choi et al. | 118/715 |
| 2004/0228141 A1 | 11/2004 | Hay et al. |
| 2004/0250955 A1 | 12/2004 | Blonigan et al. |
| 2005/0000430 A1 | 1/2005 | Jang et al. |
| 2005/0066898 A1 | 3/2005 | Schmitt et al. |
| 2005/0109460 A1 * | 5/2005 | DeDontney et al. | 156/345.33 |
| 2005/0133160 A1 | 6/2005 | Kennedy et al. |
| 2005/0133161 A1 | 6/2005 | Carpenter et al. |
| 2005/0183827 A1 | 8/2005 | White et al. |
| 2005/0196254 A1 | 9/2005 | Kim et al. |
| 2005/0199182 A1 | 9/2005 | Masuda et al. |
| 2005/0223986 A1 | 10/2005 | Choi et al. |
| 2005/0251990 A1 | 11/2005 | Choi et al. |
| 2005/0255257 A1 | 11/2005 | Choi et al. |
| 2006/0005771 A1 | 1/2006 | White et al. |
| 2006/0005926 A1 | 1/2006 | Kang |
| 2006/0054280 A1 | 3/2006 | Jang |
| 2006/0060138 A1 | 3/2006 | Keller et al. |
| 2006/0130764 A1 | 6/2006 | Quan |

| | | |
|---|---|---|
| 2006/0228496 A1 | 10/2006 | Choi et al. |
| 2006/0236934 A1 | 10/2006 | Choi et al. |
| 2007/0221128 A1* | 9/2007 | Choi et al. ............ 118/715 |
| 2008/0020146 A1 | 1/2008 | Choi et al. |

FOREIGN PATENT DOCUMENTS

| | | |
|---|---|---|
| CN | 1696768 A | 11/2005 |
| EP | 0843348 | 5/1998 |
| EP | 0985742 | 3/2000 |
| EP | 1118693 | 7/2001 |
| EP | 1167570 | 1/2002 |
| EP | 1168427 | 1/2002 |
| EP | 1286386 | 2/2003 |
| EP | 1321538 | 6/2003 |
| EP | 1386981 | 2/2004 |
| EP | 1693880 | 8/2006 |
| JP | 60-025235 | 2/1985 |
| JP | 63-187619 | 8/1988 |
| JP | 01-004481 | 1/1989 |
| JP | 01-149964 | 6/1989 |
| JP | 03-122281 | 5/1991 |
| JP | 03122285 | 5/1991 |
| JP | 04-115531 A | 4/1992 |
| JP | 08-055802 | 2/1996 |
| JP | 08-070035 | 3/1996 |
| JP | 2000-235954 A | 8/2000 |
| JP | 2000-269146 | 9/2000 |
| JP | 2001102309 | 4/2001 |
| JP | 2001-164371 | 6/2001 |
| JP | 2001-284271 | 10/2001 |
| JP | 2002-053965 A | 2/2002 |
| JP | 2002-064084 | 2/2002 |
| JP | 2002-299240 A | 10/2002 |
| JP | 2003-179037 | 6/2003 |
| JP | 2004-055895 | 2/2004 |
| JP | 2005-086208 | 3/2005 |
| JP | 2006-121057 | 5/2006 |
| KR | 1998-0032712 | 9/1998 |
| KR | 0189495 | 7/2000 |
| KR | 10-2001-0044503 | 6/2001 |
| KR | 20010077810 | 8/2001 |
| KR | 10-2003-0009853 | 2/2003 |
| KR | 10-2003-0042920 | 6/2003 |
| KR | 10-2003-0066118 | 8/2003 |
| KR | 10-2003-0077803 | 10/2003 |
| KR | 10-2004-0011910 | 2/2004 |
| KR | 10-2004-0019109 | 3/2004 |
| KR | 10-2004-0066005 | 7/2004 |
| KR | 10-2004-0100196 | 12/2004 |
| KR | 10-2004-0104197 | 12/2004 |
| KR | 10-2005-0015931 | 2/2005 |
| KR | 10-2005-0076070 | 7/2005 |
| KR | 10-2005-0080105 | 8/2005 |
| KR | 200587454 | 8/2005 |
| KR | 10-2006-0004505 | 1/2006 |
| KR | 10-2006-0045322 | 5/2006 |
| KR | 10592682 | 6/2006 |
| KR | 2007-0039931 A | 4/2007 |
| TW | 301465 | 7/2003 |
| TW | 239225 | 9/2005 |
| TW | 252223 | 4/2006 |
| TW | I276701 B | 3/2007 |
| TW | 279997 | 4/2007 |
| TW | I281838 B | 5/2007 |
| WO | WO 95/33866 | 12/1995 |
| WO | WO 99/25012 | 5/1999 |
| WO | WO 99/25895 | 5/1999 |
| WO | WO 01/83852 | 11/2001 |
| WO | WO-03002860 | 1/2003 |
| WO | WO 03/015481 | 2/2003 |
| WO | WO 03/078681 | 9/2003 |
| WO | WO 2004/064407 | 7/2004 |
| WO | WO-2005106917 | 11/2005 |

OTHER PUBLICATIONS

Chinese Office Action dated Jun. 6, 2008 for Chinese Application No. 200510106396.9.
Decision of Patent Examination and Allowance dated Nov. 30, 2007 for Korean Application No. 10-2005-87454.
European Office Action dated Jun. 12, 2008 for European Application No. 05764564.0.
Examiner's Grounds for Rejection dated May 25, 2007 for Korean Application No. 10-2005-87454.
Examiner's Grounds for Rejection dated Sep. 9, 2008 for Korean Application No. 10-2007-0079040.
Extended European Search Report dated Aug. 24, 2006 for European Application No. 05021902.1.
Japanese Notice of Reasons for Rejection dated Jul. 8, 2008 for Japanese Application No. 2004-353175.
Official Letter dated Jan. 27, 2005 for Taiwan Application No. 93136349.
Partial Search Report dated Mar. 15, 2006 for International Application No. PCT/US2005/024165.
"13.56 MHz Hollow Cathode Plasma Source HCD-P. 100" Plasma Consult Germany—Technical Note.
"13.56 MHz Hollow Cathode Plasma Source HCD-P 300" Plasma Consult Germany—Technical Note.
Anders, et al. "Characterization of Low-Energy Constricted-Plasma Source," Ernest Orlando Lawrence Berkeley National Laboratory & Institute of Physics, Germany (Aug. 1997), pp. 1-11.
Anders, et al. "Working Principle of the Hollow-Anode Plasma Source," Lawrence Berkely National Laboratory, USB, pp. 1-10.
Bardos, et al. "Thin Film Processing by Radio Frequency Hollow Cathodes," Surface and Coatings Technology (1997), pp. 723-728.
Chinese Office Action dated Jun. 15, 2007 for Chinese Application No. 200410082199.3.
European Office Action dated Dec. 12, 2007 for European Patent Application No. 05000831.7.
European Office Action dated Feb. 23, 2007 for European Application No. 05000831.7-1215.
European Partial Search Report dated May 23, 2006 for European Application No. 05021902.1.
European Search Report dated Feb. 16, 2006 for European Application No. 05000831.7-2122.
Extended European Search Report dated Aug. 30, 2006 for European Application No. 05021902.1.
International Preliminary Report on Patentability dated Jan. 25, 2007 for International Application No. PCT/US2005/24165.
International Search Report and Written Opinion dated Jul. 19, 2006 for International Application No. PCT/US2005/24165.
International Search Report mailed Aug. 11, 2005 for International Application No. PCT/US05/12832.
Kim et al. "A Novel Self-Aligned Coplanar Amorphous Silicon Thin Film Transistor," ISSN0098-0966X/98/2901 (1998).
Korean Notice of Preliminary Rejection dated May 7, 2007 for Korean Application No. 10-2004-0108843.
Korean Office Action dated Aug. 29, 2006 for Korean Application No. 10-2004-0108843.
Korean Office Action dated Nov. 22, 2007 for Korean Patent Application No. 10-2007-0079040.
Korean Office Action dated Oct. 31, 2006 for Korean Application No. 10-2005-87454.
Kuo "Plasma Enhanced Chemical Vapor Deposited Silicon Nitride as a Gate Dielectric Film for Amorphous Silicon Thin Film Transistors—A Critical Review," Vacuum, vol. 51, No. 4, pp. 741-745, Elsevier Science, Ltd., Pergamon Press, Great Britain, Dec. 1998.
Kyung-ha "A Study on Laser Annealed Polycrystalline Silicon Thin Film Transistors (TFTs) with SiNx Gate Insulator," Kyung Hee University, Ch. 2 & 4 (1998).
Lee, et al. "High Density Hollow Cathode Plasma Etching for Field Emission Display Applications", Journal of Information Display, vol. 2, No. 4, (2001), pp. 1-7.
Lieberman et al. "Standing wave and skin effects in large-area, high-frequency capacitive discharges," Plasma Sources Sci. Technolo., vol. 11, pp. 283-293 (2002).
Park "Bulk and interface properties of low-temperature silicon nitride films deposited by remote plasma enhanced chemical vapor deposition," Journal of Materials Science: Materials in Electronics, vol. 12, pp. 515-522 (2001).

Sazonov et al. "Low Temperature a-Si:H TFT on Plastic Films: Materials and Fabrication Aspects," Proc. 23rd International Conference on Microelectronics (MIEL 2002), vol. 2, Nis, Yugosolvia (May 12-15, 2002).

Taiwan Search Report dated Apr. 5, 2007 for Taiwanese Patent Application No. TW 94130602.

Third Party Submission dated Nov. 2006 for Korean Application No. KR 10-2004-0108843.

Thomasson et al. "High Mobility Tri-Layer a-Si:H Thin Film Transistors with Ultra-Thin Active Layer," IEEE Electron Device Letters, vol. 18, No. 8, Aug. 1997, pp. 397-399.

Office Action dated Feb. 24, 2009 for European Patent Application No. 05000831.7-1215.

Notice of Reasons for Rejection dated Feb. 17, 2009 for Japanese Patent Application No. 2005-272673.

Office Action dated Dec. 19, 2008 for Chinese Patent Application No. 200580022984.2.

Notice of Reasons for Rejection for Japanese Patent Application No. P2004-353175 dated Jun. 11, 2009.

Non-final office action for U.S. Appl. No. 11/473,661 dated Jul. 22, 2009.

Final office action for U.S. Appl. No. 11/473,661 dated Mar. 23, 2010.

Office action for European Patent Application No. 05000831.7-1215 dated Mar. 17, 2010.

Office action for Chinese Patent Application No. 2007101669357 dated Feb. 5, 2010.

Office Action for Chinese Patent Application No. 200810099760.7 dated Feb. 5, 2010.

Notice to File a Response for Korean Patent Application No. 10-2008-0053726 dated May 18, 2010.

Taiwan Office Action for application No. 097121591 dated Mar. 24, 2011.

Chinese office action dated Nov. 3, 2010 for Chinese Patent Application No. 200710166935.7

Korean office action dated Dec. 10, 2010 for Korean patent application No. 10-2008-0053726.

Office Action for Taiwan Patent Application No. 97121591 dated Oct. 4, 2011.

Taiwan Office Action dated Jun. 4, 2012 for Taiwan Application No. 097121591.

\* cited by examiner

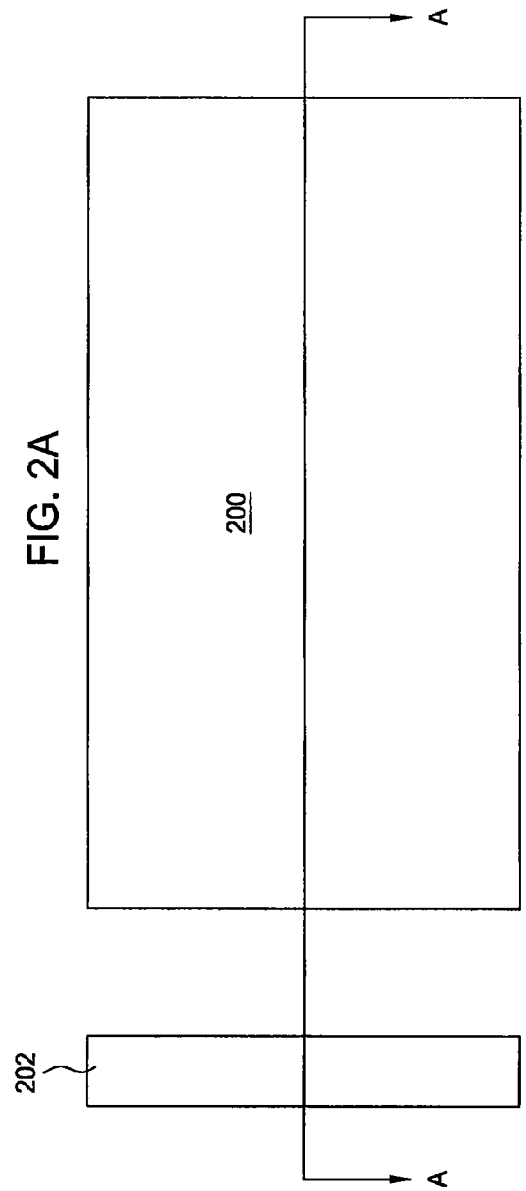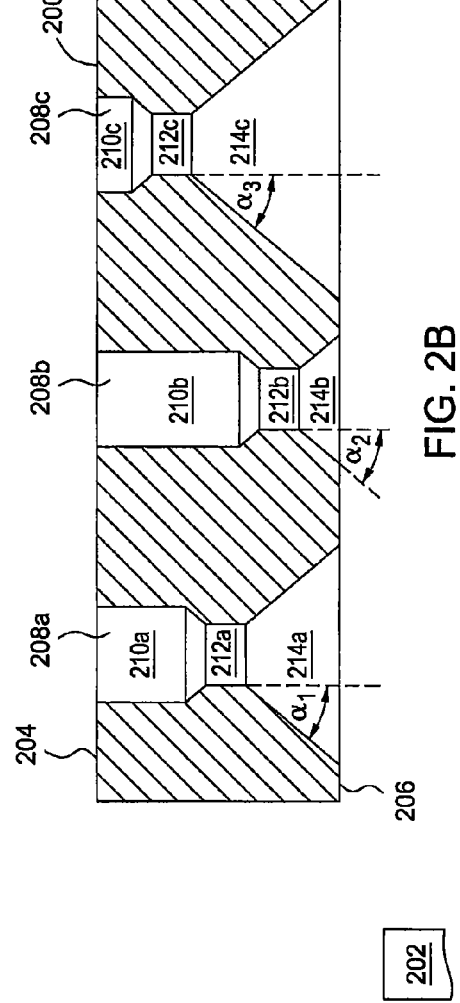

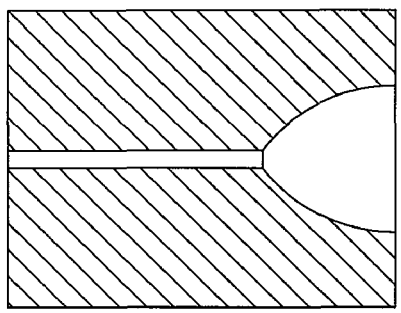
FIG. 3A
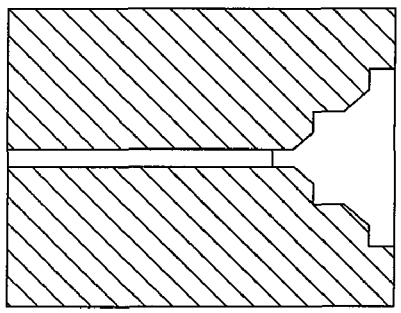
FIG. 3B
FIG. 3C
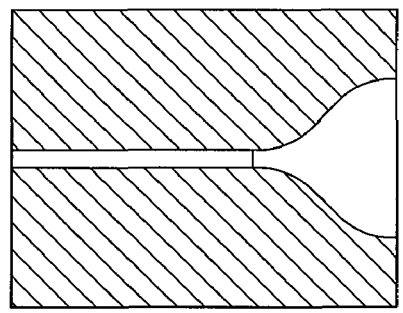
FIG. 3D
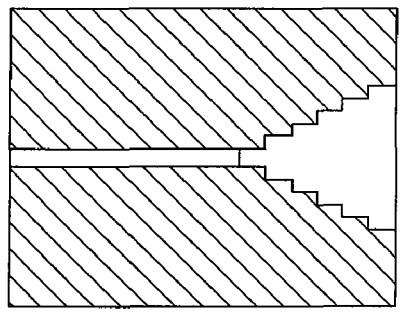
FIG. 3E
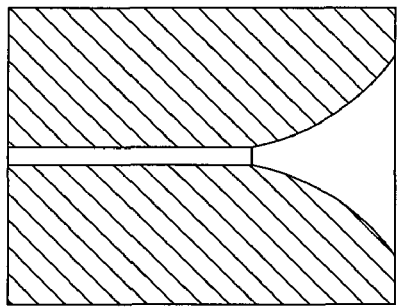
FIG. 3F

DIFFUSER PLATE WITH SLIT VALVE COMPENSATION

CROSS-REFERENCE TO RELATED APPLICATIONS

This application is a continuation-in-part of U.S. patent application Ser. No. 10/889,683, filed Jul. 12, 2004, now U.S. Pat No. 8,083,853 which claims benefit of U.S. provisional patent application Ser. No. 60/570,876, filed May 12, 2004. Each of the aforementioned related patent applications is herein incorporated by reference.

BACKGROUND OF THE INVENTION

1. Field of the Invention

Embodiments of the present invention generally relate to a diffuser plate for a chemical vapor deposition (CVD) system designed to compensate for plasma non-uniformity caused by chamber slit valves.

2. Description of the Related Art

Plasma enhanced chemical vapor deposition (PECVD) is a deposition method that has long been used to deposit may films onto semiconductor substrates. PECVD has recently been used to deposit films on large area substrates such as solar panel substrates, flat panel display substrates, and large area thin film transistor substrates. Market forces continue to drive down the cost of flat panel displays while increasing the size of the substrate. Substrate sizes greater than 1 square meter are not uncommon in flat panel display processes.

Gas diffuser plates may be used to ensure an even distribution of the deposition plasma throughout the processing chamber. An even distribution of plasma may aid in film uniformity across the substrate. With increasing substrate size, however, obtaining an even distribution of plasma within the processing chamber can be a challenge. Therefore, there is a need in the art for an improved gas diffuser plate.

SUMMARY OF THE INVENTION

The present invention generally comprises a diffuser plate for a PECVD chamber. The diffuser plate comprises a plurality of hollow cathode cavities. The edge of the diffuser plate that will reside closest to a slit valve within a processing chamber may have the shape and/or size of the hollow cathode cavities adjusted to compensate for the proximity to the slit valve. By adjusting the shape and/or size of the hollow cathode cavities closest to the slit valve, the diffuser plate may permit a uniform plasma distribution across the processing chamber and thus, a uniform film thickness upon a substrate during a PECVD process.

In one embodiment, a gas distribution plate assembly is disclosed. The assembly comprises a diffuser plate element having an upstream side, a downstream side, a first edge to be disposed adjacent a slit valve in a processing chamber, a center, and a second edge, and a plurality of gas passages passing between the upstream side and the downstream side. The plurality of gas passages comprise a first gas passage having a first hollow cathode cavity disposed adjacent the first edge of the diffuser plate element, a second gas passage having a second hollow cathode cavity disposed adjacent the center of the diffuser plate element, and a third gas passage having a third hollow cathode cavity disposed adjacent the second edge, wherein the first hollow cathode cavity, second hollow cathode cavity, and third hollow cathode cavity have different volumes.

In another embodiment, a plasma processing chamber is disclosed. The chamber comprises a chamber body having a plurality of walls, one or more slit valves disposed in at least one of the plurality of walls, and a diffuser plate. The diffuser plate comprises a diffuser plate element having an upstream side, a downstream side, a first edge to be disposed adjacent a slit valve of the one or more slit valves, a center, and a second edge, and a plurality of gas passages passing between the upstream side and the downstream side. The plurality of gas passages comprise a first gas passage having a first hollow cathode cavity disposed adjacent the first edge of the diffuser plate element, a second gas passage having a second hollow cathode cavity disposed adjacent the center of the diffuser plate element, and a third gas passage having a third hollow cathode cavity disposed adjacent the second edge, wherein the first hollow cathode cavity, second hollow cathode cavity, and third hollow cathode cavity have different volumes.

In another embodiment, a plasma processing method is disclosed. The method comprises flowing a processing gas through a diffuser plate, the diffuser plate having a plurality of gas passages disposed therethrough and arranged such that a first gas passage disposed adjacent a slit valve is different than both a second gas passage disposed adjacent a center of the diffuser plate and a third gas passage disposed adjacent an edge of the diffuser plate, biasing the diffuser plate, and igniting a plasma within the gas passages.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2A is a schematic top view of a diffuser plate in relation to a slit valve according to one embodiment of the invention.

FIG. 2B is a schematic cross sectional view taken along line A-A of FIG. 2A.

FIGS. 3A-3F are schematic cross sectional views of gas passages having hollow cathode cavities according other embodiments of the invention.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally comprises a diffuser plate for a PECVD chamber. The diffuser plate comprises a plurality of hollow cathode cavities. The edge of the diffuser plate that will reside closest to a slit valve within a processing chamber may have the shape and/or size of the hollow cathode cavities adjusted to compensate for the proximity to the slit valve. By adjusting the shape and/or size of the hollow cathode cavities closest to the slit valve, the diffuser plate may permit a uniform plasma distribution across the processing chamber and thus, a uniform film thickness upon a substrate during a PECVD process.

The present invention will be illustratively described below in reference to a PECVD system configured to process large area substrates such as a PECVD system available from AKT, a division of Applied Materials, Inc., Santa Clara, Calif. However, it is to be understood that the invention has utility in other system configurations such as those utilized to process small or round substrates. The invention also has utility in processing systems manufactured by other manufacturers.

Figure 1:
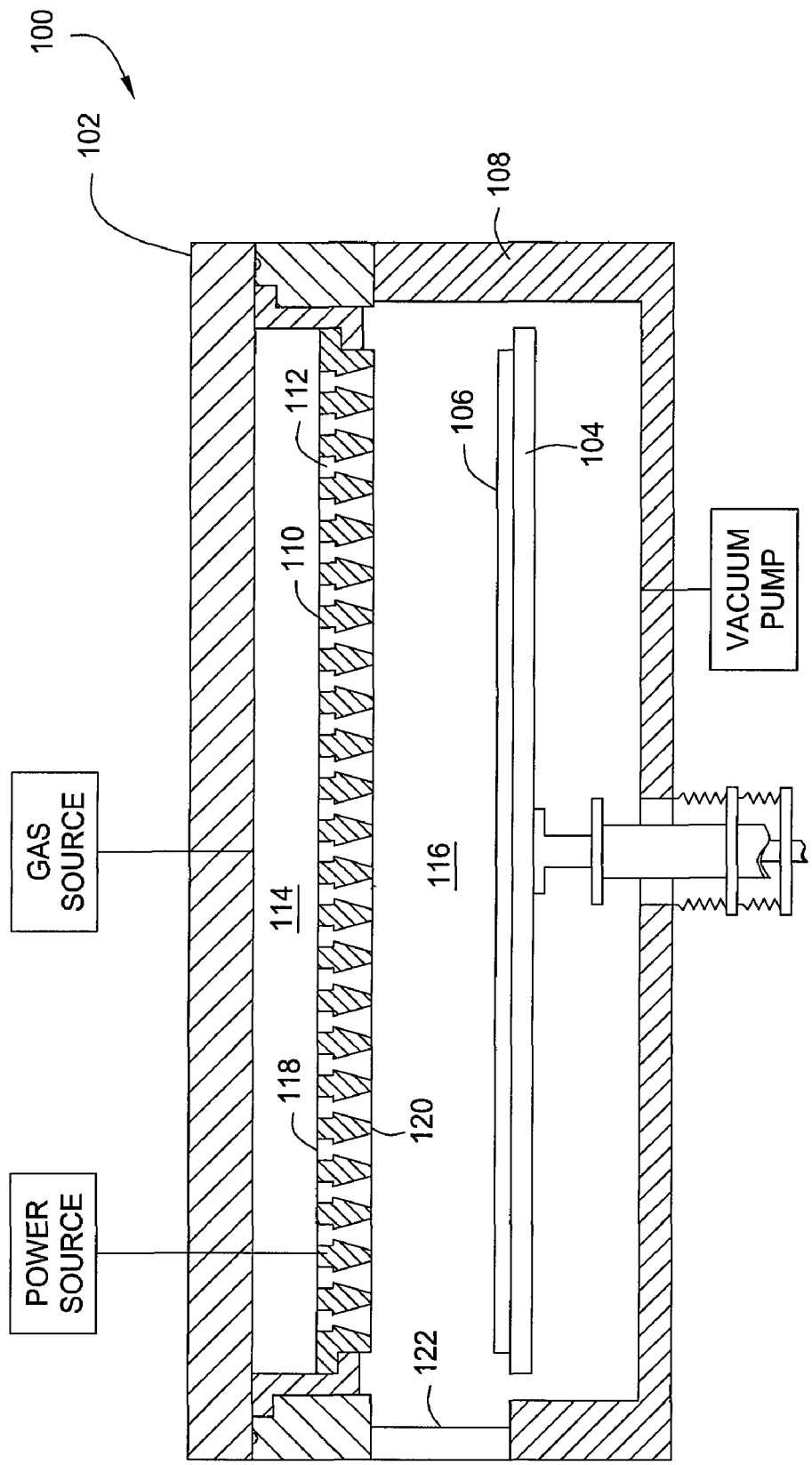
FIG. 1 is a schematic cross sectional view of a processing chamber according to one embodiment of the invention.

FIG. 1 is a schematic cross sectional view of a processing chamber 100 according to one embodiment of the invention. The processing chamber 100 comprises a chamber body having a lid 102 and:walls 108. Within at least one wall 108, one or more slit valves 122 may be present to permit insertion of substrates 106 to the processing space 116 and removal of substrates 106 from the processing space 116. The processing space 116 may be bound by the slit valve 122, chamber walls 108, substrate 106, and diffuser plate 110. In one embodiment, the diffuser plate 110 may be biased by a power source. The substrate 106 may be disposed on a susceptor 104 that may translate up and down to raise and lower the substrate 106 as necessary.

Gas may be introduced to an area between the diffuser plate 110 and the lid 102 called the plenum 114. The gas may be evenly distributed within the plenum 114 due to the presence of gas passages 112 that extend from an upstream side 118 of the diffuser plate through to the downstream side 120. The gas passages, as will be described below, may be designed to create a substantially uniform gas pressure within the plenum.

FIG. 2A is a schematic top view of a diffuser plate 200 in relation to a slit valve 202 according to one embodiment of the invention. FIG. 2B is a schematic cross sectional view taken along line A-A of FIG. 2A. The diffuser plate 200 comprises an upstream side 204 that would be adjacent to the plenum and a downstream side 206 that would be adjacent the processing space during processing. A plurality of gas passageways 208a-208c may be present within the diffuser plate 200 extending between the upstream side 204 and the downstream side 206.

Each gas passageway 208a-208c may comprise a top bore 210a-210c, a choke 212a-212c, and a hollow cathode cavity 214a-214c. The top bore 210a-210c may be coupled with the upstream side 204 of the diffuser plate 200 while the hollow cathode cavity 214a-214c may be coupled with the downstream side 206 of the diffuser plate 200. The choke 212a-212c may be coupled between the hollow cathode cavities 214a-214c and the top bores 210a-210c.

The gas passages 208a-208c may be formed by drilling a bore into the diffuser plate 200 from the upstream side 204 and drilling another bore into the diffuser plate 200 from the downstream side 206 such that the two bores are coupled together. The location where the two bores meet forms the choke 212a-212b of the diffuser plate 200.

The choke 212a-212c functions to permit the gas distributed within the plenum to be evenly distributed across the upstream side 204 of the diffuser plate 200 by narrowing the channel through which the gas may flow through the diffuser plate. The narrowed channel of choke 212a-212c backs up the gas and thus spreads out the gas across the upstream side 204 of the diffuser plate 200 so that an equal amount of gas may flow through each gas passage 208a-208c. In one embodiment, the chokes 212a-212c may all have the same height and width. In another embodiment, the chokes 212a-212c may have varying heights and/or widths. Additionally, the chokes 212a-212c may be spaced the same or different distances from the upstream side 204 of the diffuser plate 200.

The gas passages 208a-208c also comprise hollow cathode cavities 214a-214c. The hollow cathode cavities 214a-214c may be cone or cylinder shaped or a combination of both. The hollow cathode cavities 214a-214c are sized to permit the ignition of a plasma within the hollow cathode cavities 214a-214c. In other words, a plasma may be ignited within the diffuser plate 200 itself rather than within a processing space. By igniting the plasma within the hollow cathode cavities 214a-214c, the shape of the plasma may be controlled because the shape and/or size of the hollow cathode cavities 214a-214c may affect the shape and/or intensity of the plasma within the chamber.

Each hollow cathode cavity 214a-214c may have a different surface area or volume. Additionally, the flaring angles $\alpha_1$-$\alpha_3$, may be the same and/or different for the hollow cathode cavity 214a-214c. The flaring angles $\alpha_1$-$\alpha_3$ are the angles at which the walls of the hollow cathode cavities 214a-214c extend from the choke 212a-212c. It has surprisingly been found that the slit valve 202 may affect the uniformity of the plasma and hence, the uniformity of the deposition upon the substrate.

Under conditions where the gas passages 208a-208c are substantially identical across the diffuser plate 200, it has been found that the area of the center of the substrate may have a greater amount of deposition compared to the remainder of the substrate. It has also been discovered that the area of the substrate adjacent to the slit valve 202 may have a greater amount of deposition compared to the remainder of the substrate, although the amount of deposition occurring on the substrate adjacent to the slit valve may be less than the amount of deposition occurring at the center of the substrate.

To compensate for the uneven deposition, the surface area and/or volume of the hollow cathode cavities 214a-214c may be adjusted. Reference will be made to a diffuser plate having three gas passages 208a-208c, but it is to be understood that more gas passages 208a-208c may be present. The gas passage 208b corresponding to the center of the substrate may have a smaller hollow cathode cavity 214b surface area and/or volume. The gas passage 208c corresponding to the edge of the substrate where deposition may be less may have a hollow cathode cavity 214c with a greater surface area and/or volume as compared to the hollow cathode cavity 214b of the gas passage 208b corresponding to the center of the substrate. Likewise, the gas passage 208a adjacent to the slit valve 202 may have a hollow cathode cavity 214a that has a greater surface area and/or volume as compared to the hollow cathode cavity 214b corresponding to the center of the substrate, but a smaller surface area and/or volume as compared to the hollow cathode cavity 214c corresponding to the edge of the substrate. While the hollow cathode cavities 214a-214c are different, the chokes 212a-212c may be substantially identical or different.

It has also surprisingly been found that the corners of the large area substrates produce a similar effect as compared to the slit valve during plasma processing. Thus, when using a diffuser plate having substantially identical gas passages, the amount of deposition that occurs near the corner of the substrate may be greater than the amount that occurs at the edge of the substrate but less than the amount of deposition that occurs near the center of the substrate. To compensate for the corner-center-edge deposition non-uniformity, the hollow cathode cavities 214a-214c may be arranged substantially identical to the arrangement discussed above in relation to the slit valve-center-edge deposition non-uniformity. It is to be understood that the diffuser plate may have both slit valve compensation as well as corner compensation. FIGS. 3A-3F are schematic cross sectional views of gas passages having hollow cathode cavities according other embodiments of the invention.

Figure 4:
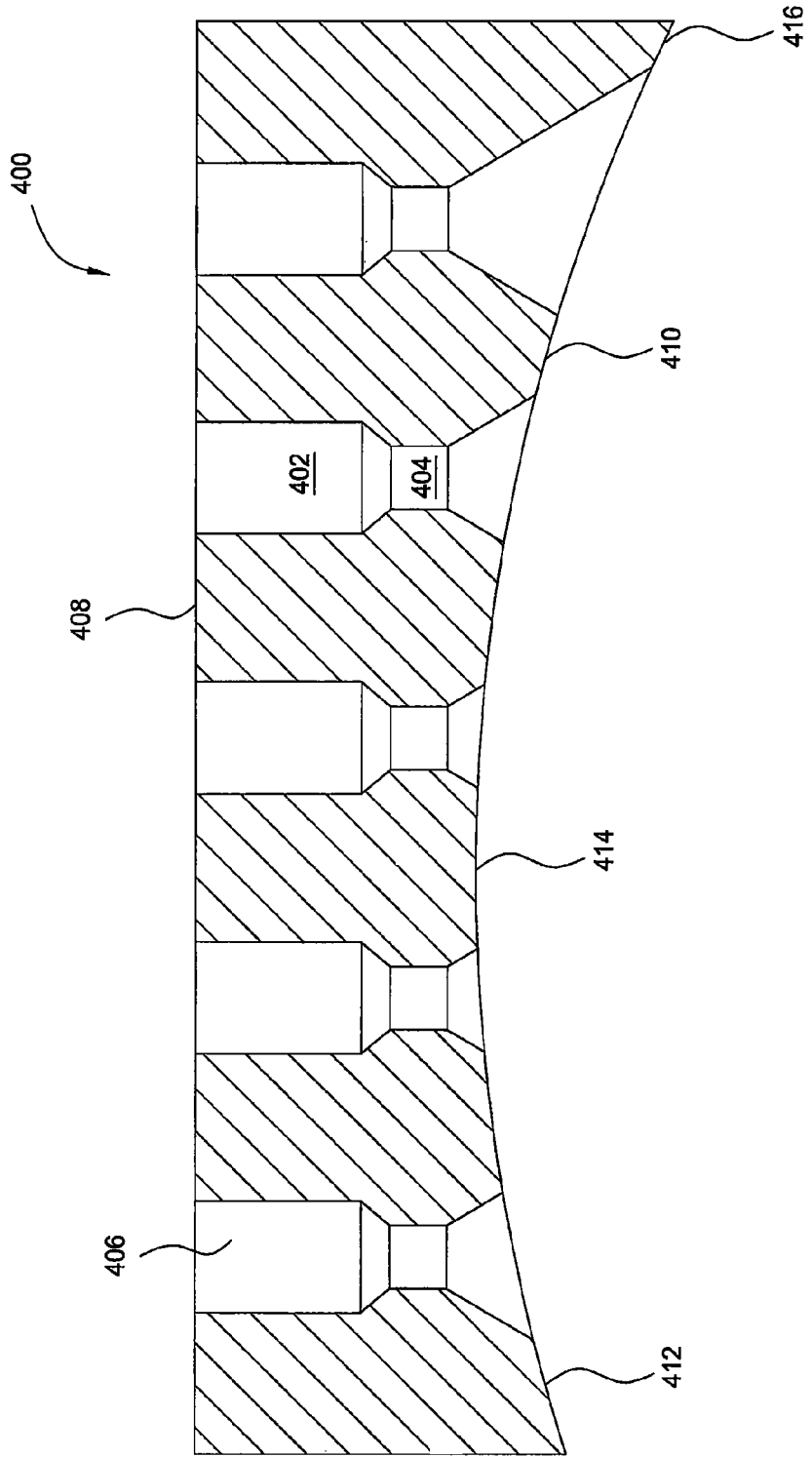
FIG. 4 is a schematic cross sectional view of a diffuser plate according to another embodiment of the invention.

FIG. 4 is a schematic cross sectional view of a diffuser plate 400 according to one embodiment of the invention. The top bore 402 and the choke 404 for each gas passage extending between the upstream surface 408 and the downstream surface 410 are substantially identical. The hollow cathode cavities 406, however, may be different across the diffuser plate 400. The hollow cathode cavities 406 closest to the slit valve may have a smaller surface area and/or volume as compared to the hollow cathode cavities 406 corresponding to the edge of the diffuser plate. The hollow cathode cavities 406 corresponding to the slit valve may have a surface area and/or volume greater than the surface area and/or volume of the hollow cathode cavities 406 corresponding to the center of the diffuser plate. The hollow cathode cavities 406 may be different due to the undulating shape of the downstream surface. The downstream surface 410 may have a concave portion 414 off-center of the downstream surface 410 that gently slopes to an edge portion 416 and another portion 412 near the slit valve. The downstream surface 410 may be formed by machining out the downstream side 410 of the diffuser plate 400 after the top bore 402 and hollow cathode cavities 406 have been drilled into the diffuser plate 400.

By compensating for a slit valve in diffuser plate design, a uniform film may be deposited onto a substrate.

While the foregoing is directed to embodiments of the present invention, other and further embodiments of the invention may be devised without departing from the basic scope thereof, and the scope thereof is determined by the claims that follow.

The invention claimed is:

1. A gas distribution plate assembly, comprising:
    a diffuser plate element having an upstream side, a downstream side, a first edge to be disposed adjacent a slit valve in a processing chamber, a center, and a second edge; and
    a plurality of gas passages passing between the upstream side and the downstream side, each gas passage having a choke and a hollow cathode cavity with the chokes of the gas passages being substantially identical, the plurality of gas passages comprise:
        a first gas passage having a first hollow cathode cavity disposed adjacent the first edge of the diffuser plate element;
        a second gas passage having a second hollow cathode cavity disposed adjacent the center of the diffuser plate element; and
        a third gas passage having a third hollow cathode cavity disposed adjacent the second edge, wherein the first hollow cathode cavity, second hollow cathode cavity, and third hollow cathode cavity have different volumes, wherein the third hollow cathode cavity volume is greater than the first hollow cathode cavity volume and the second hollow cathode cavity volume.

2. The assembly of claim 1, wherein the diffuser plate element comprises at least one corner portion having a fourth hollow cathode cavity, and wherein the fourth hollow cathode cavity volume is less than the third hollow cathode cavity volume.

3. The assembly of claim 1, wherein the downstream side comprises a substantially concave portion.

4. The assembly of claim 1, wherein each choke has a length and a diameter sufficient to promote a substantially uniform back pressure, and each choke is coupled with a hollow cathode cavity.

5. A gas distribution plate assembly, comprising:
    a diffuser plate element having an upstream side, a downstream side, a first edge to be disposed adjacent a slit valve in a processing chamber, a center, and a second edge; and
    a plurality of gas passages passing between the upstream side and the downstream side, each gas passage having a choke and a hollow cathode cavity with the chokes of the gas passages being substantially identical, the plurality of gas passages comprise:
        a first gas passage having a first hollow cathode cavity disposed adjacent the first edge of the diffuser plate element;
        a second gas passage having a second hollow cathode cavity disposed adjacent the center of the diffuser plate element; and
        a third gas passage having a third hollow cathode cavity disposed adjacent the second edge, wherein the first hollow cathode cavity, second hollow cathode cavity, and third hollow cathode cavity have different volumes, wherein each choke has a length and a diameter sufficient to promote a substantially uniform back pressure, each choke is coupled with a hollow cathode cavity.

6. A plasma processing chamber, comprising:
    a chamber body having a plurality of walls;
    one or more slit valves disposed in at least one of the plurality of walls; and
    a diffuser plate comprising:
        a diffuser plate element having an upstream side, a downstream side, a first edge to be disposed adjacent a slit valve of the one or more slit valves, a center, and a second edge; and
        a plurality of gas passages passing between the upstream side and the downstream side, each gas passage having a choke and a hollow cathode cavity with the chokes of the gas passages being substantially identical, the plurality of gas passages comprise:
            a first gas passage having a first hollow cathode cavity disposed adjacent the first edge of the diffuser plate element;
            a second gas passage having a second hollow cathode cavity disposed adjacent the center of the diffuser plate element; and
            a third gas passage having a third hollow cathode cavity disposed adjacent the second edge, wherein the first hollow cathode cavity, second hollow cathode cavity, and third hollow cathode cavity have different volumes, wherein the third hollow cathode cavity volume is greater than the first hollow cathode cavity volume and the second hollow cathode cavity volume.

7. The chamber of claim 6, wherein the diffuser plate element comprises at least one corner portion having a fourth hollow cathode cavity, and wherein the fourth hollow cathode cavity volume is less than the third hollow cathode cavity volume.

8. The chamber of claim 6, wherein the downstream side comprises a substantially concave portion.

9. The chamber of claim 6, wherein each choke has a length and a diameter sufficient to promote a substantially uniform back pressure, and each choke is coupled with a hollow cathode cavity.

10. A plasma processing chamber, comprising:
a chamber body having a plurality of walls;
one or more slit valves disposed in at least one of the plurality of walls; and
a diffuser plate comprising:
   a diffuser plate element having an upstream side, a downstream side, a first edge to be disposed adjacent a slit valve of the one or more slit valves, a center, and a second edge; and
   a plurality of gas passages passing between the upstream side and the downstream side, each gas passage having a choke and a hollow cathode cavity with the chokes of the gas passages being substantially identical, the plurality of gas passages comprise:
      a first gas passage having a first hollow cathode cavity disposed adjacent the first edge of the diffuser plate element;
      a second gas passage having a second hollow cathode cavity disposed adjacent the center of the diffuser plate element; and
      a third gas passage having a third hollow cathode cavity disposed adjacent the second edge, wherein the first hollow cathode cavity, second hollow cathode cavity, and third hollow cathode cavity have different volumes, wherein each choke has a length and a diameter sufficient to promote a substantially uniform back pressure, each choke is coupled with a hollow cathode cavity.

11. A gas distribution plate assembly, comprising:
a diffuser plate element having an upstream side, a downstream side, a first edge to be disposed adjacent a slit valve in a processing chamber, a center, and a second edge opposite the first edge; and
a plurality of gas passages passing between the upstream side and the downstream side, each gas passage having a choke and a hollow cathode cavity with the chokes of the gas passages being substantially identical, the plurality of gas passages comprise:
   a first gas passage having a first hollow cathode cavity disposed adjacent the first edge of the diffuser plate element;
   a second gas passage having a second hollow cathode cavity disposed adjacent the center of the diffuser plate element; and
   a third gas passage having a third hollow cathode cavity disposed adjacent the second edge, wherein the first hollow cathode cavity, second hollow cathode cavity, and third hollow cathode cavity have different volumes.

12. The assembly of claim 11, wherein the third hollow cathode cavity volume is greater than the first hollow cathode cavity volume and the second hollow cathode cavity volume.

13. The assembly of claim 11, wherein each choke has a length and a diameter to promote a uniform back pressure, each choke is coupled with a hollow cathode cavity.

14. The assembly of claim 11, wherein the diffuser plate element comprises at least one corner portion having a fourth hollow cathode cavity, and wherein the fourth hollow cathode cavity volume is less than the third hollow cathode cavity volume.

15. The assembly of claim 11, wherein the downstream side comprises a concave portion.

16. A plasma processing chamber, comprising:
a chamber body having a plurality of walls;
one or more slit valves disposed in at least one of the plurality of walls; and
a diffuser plate comprising:
   a diffuser plate element having an upstream side, a downstream side, a first edge disposed adjacent a slit valve of the one or more slit valves, a center, and a second edge opposite the first edge; and
   a plurality of gas passages passing between the upstream side and the downstream side, each gas passage having a choke and a hollow cathode cavity with the chokes of the gas passages being substantially identical, the plurality of gas passages comprise:
      a first gas passage having a first hollow cathode cavity disposed adjacent the first edge of the diffuser plate element;
      a second gas passage having a second hollow cathode cavity disposed adjacent the center of the diffuser plate element; and
      a third gas passage having a third hollow cathode cavity disposed adjacent the second edge, wherein the first hollow cathode cavity, second hollow cathode cavity, and third hollow cathode cavity have different volumes.

17. The chamber of claim 16, wherein each choke has a length and a diameter to promote a uniform back pressure, each choke is coupled with a hollow cathode cavity.

18. The chamber of claim 16, wherein the third hollow cathode cavity volume is greater than the first hollow cathode cavity volume and the second hollow cathode cavity volume.

19. The chamber of claim 16, wherein the diffuser plate element comprises at least one corner portion having a fourth hollow cathode cavity, and wherein the fourth hollow cathode cavity volume is less than the third hollow cathode cavity volume.

20. The chamber of claim 16, wherein the downstream side comprises a concave portion.

21. An apparatus, comprising:
a diffuser plate element having an upstream side, a downstream side, a plurality of passages extending therebetween, a first edge, and a second edge adjacent the first edge, each passage having a choke with the chokes of the gas passages being substantially identical, and each gas passage having a cone shaped portion extending from the downstream side towards the upstream side, wherein a cone shaped portion adjacent the first edge of the diffuser plate, a cone shaped portion adjacent the center of the diffuser plate, and a cone shaped portion adjacent the second edge of the diffuser plate have different volumes.

22. The apparatus of claim 21, wherein the cone shaped portion adjacent the second edge has a greater volume than the cone shaped portion adjacent the first edge and the cone shaped portion adjacent the center.

23. The apparatus of claim 21, wherein the diffuser plate comprises at least one corner portion coupled between the first edge and the second edge and having a first passage of the plurality of passages that has a first cone shaped portion, and wherein the cone shaped portion adjacent the second edge has a greater volume than the first cone shaped portion.

24. The apparatus of claim 21, wherein the downstream side has a concave portion.

* * * * *